United States Patent [19]
Sakai et al.

[11] Patent Number: 4,721,629
[45] Date of Patent: Jan. 26, 1988

[54] METHOD OF MANUFACTURING PHOTOVOLTAIC DEVICE

[75] Inventors: Souichi Sakai; Shoichi Nakano; Yukinori Kuwano, all of Osaka, Japan

[73] Assignee: Sanyo Electric Co., Ltd., Japan

[21] Appl. No.: 778,377

[22] Filed: Dec. 19, 1985

Related U.S. Application Data

[63] Continuation of Ser. No. 613,520, May 23, 1984, abandoned.

[30] Foreign Application Priority Data

Jun. 21, 1983 [JP] Japan .............................. 58-112093

[51] Int. Cl.$^4$ ............................................. B05D 3/06
[52] U.S. Cl. ...................................... 427/35; 156/643; 427/38; 427/53.1; 427/74; 427/75; 427/76
[58] Field of Search .................... 427/53.1, 38, 74, 35, 427/75, 76; 156/643

*Primary Examiner*—Bernard D. Pianalto
*Attorney, Agent, or Firm*—Darby & Darby

[57] ABSTRACT

A transparent conductive film is formed on a glass substrate covering substantially its entire surface area and this transparent conductive film is divided into a plurality of transparent conductive parts per each photoelectric converting region. The photoelectric converting region is of a nearly rectangular shape, and accordingly, in order to divide the transparent conductive film into respective transparent conductive film parts, a laser beam is irradiated along all longitudinal and lateral sides of the rectangle. Thereby, the transparent conductive film parts corresponding to the photoelectric converting regions are formed as island regions. Semiconductor film parts are formed on the transparent conductive film parts divided into island regions corresponding to respective photoelectric converting regions and subsequently aluminum film parts are formed on these semiconductor film parts. Transparent conductive film parts are electrically connected to aluminum film parts of adjacent photoelectric converting regions. Thus, a photovoltaic device is manufactured wherein a plurality of photoelectric converting regions are formed on the substrate and respective photoelectric converting regions are connected in a series fashion.

10 Claims, 36 Drawing Figures

METHOD OF MANUFACTURING PHOTOVOLTAIC DEVICE

This is a continuation of application Ser. No. 613,520, filed May 23, 1984, now abandoned.

BACKGROUND OF THE INVENTION

1. Field of the Invention

The present invention relates to a method of manufacturing a photovoltaic device. More specifically, the present invention relates to a method of manufacturing a photovoltaic device wherein a plurality of photoelectric converting regions are formed on the substrate and respective photoelectric converting regions are connected in a series fashion.

2. Description of the Prior Art

Conventionally, the photovoltaic device is known wherein a plurality of photoelectric converting regions are formed on one substrate and these photoelectric converting regions are electrically connected in a series fashion. One example of such a photovoltaic device is, for example, disclosed in the U.S. Pat. No. 4,281,208, patented on July 28, 1981, the U.S. Pat. No. 4,292,092, patented on Sept. 29, 1981, and so on.

FIG. 1 is a perspective view of the major part showing an example of a photovoltaic device being the background of the present invention. The structure of the photovoltaic device as shown in FIG. 1 is disclosed also in two U.S. patents as cited above. This photovoltaic device comprises a glass substrate 10, and on the glass substrate 10, a plurality of (three in the illustrated example) photoelectric converting regions 14a, 14b and 14c are formed. First electrode film parts, that is, transparent conductive film parts 11a, 11b and 11c are formed corresponding to these photoelectric converting regions 14a, 14b and 14c, respectively. Semiconductor film parts 12a, 12b and 12c comprising amorphous silicon are formed on respective transparent conductive film parts 11a, 11b and 11c. Respective semiconductor film parts 12a, 12b and 12c contain a PIN junction which is parallel to the film surface. Respective end portions 11a', 11b' and 11c' of the transparent conductive film parts 11a, 11b and 11c of respective photoelectric converting regions 14a, 14b and 14c are exposed beyond the end portions of the semiconductor film parts 12a, 12b and 12c in the longitudinal direction of the substrate 10. Then, on the semiconductor film parts 12a, 12b and 12c, second electrode film parts, that is, back electrode film parts 13a, 13b and 13c are formed, respectively. Respective end portions 13a' and 13b' of these back electrode film parts 13a and 13b are connected to the exposed transparent conductive film parts 11b' and 11c' of adjacent photoelectric converting regions, respectively. When the light impinges through the glass substrate 10 and the transparent conductive film parts 11a, 11b and 11c, respective semiconductor film parts 12a, 12b and 12c generate photoelectromotive forces, respectively. The photoelectromotive forces generated by respective semiconductor film parts 12a, 12b and 12c are taken out between the transparent conductive film part 11a and the back electrode film part 13c in a series fashion, that is, in a cumulative fashion.

In the photovoltaic device as shown in FIG. 1, to obtain a higher energy efficiency, the light utilization rate must be made larger. That is, the effective area of the semiconductor film part actually contributing to power generation is to be made larger. It is known as is disclosed in the U.S. Pat. No. 4,292,092 cited above that for the purpose of enlarging the effective area as described above, a transparent conductive film formed on the glass substrate is divided into transparent conductive film parts corresponding to respective photoelectric converting regions by irradiating a laser beam.

FIG. 2 is a view showing an example of the pattern of the transparent conductive film parts of the photovoltaic device as shown in FIG. 1. The transparent conductive film formed on the one main surface of the glass substrate 10 in a substantially entire fashion is removed by irradiating a laser beam to form spaces 7, 7, . . . . By these spaces 7, 7, . . . , the transparent conductive film is divided into parts corresponding to respective photoelectric converting regions 14a, 14b and 14c. Then, as shown in FIG. 1, the semiconductor film parts 12a, 12b and 12c and the back electrode film parts 13a, 13b and 13c are formed in sequence. In the photovoltaic device thus completed, the spaces 7 between respective photoelectric converting regions 14a, 14b and 14c can be made small, and thereby the desired end of increasing the effective area actually contributing to power generation can be attained. However, the results of the experiments conducted by the present inventors were such that respective first and second electrode film parts of the photoelectric converting regions 14a, 14b and 14c came in contact with each other for some reason, and as a result an accident of short-circuit in the photoelectric converting region took place. An occurrence of such a short-circuit accident reduces the yield rate of manufacturing of the photovoltaic device, and consequently causes a reduction in quality and a rise in cost thereof.

SUMMARY OF THE INVENTION

Therefore, a principal objective of the present invention is to provide a method of manufacturing a photovoltaic device which can prevent an accident of short-circuit in the photoelectric converting region.

Another objective of the present invention is to provide a method of manufacturing a photovoltaic device which can improve the yield rate of manufacturing, and thereby improve the quality and reduce the cost.

To attain the above-mentioned objective, in the present invention, the first electrode film which is formed on the insulating surface of the substrate in a substantially entire fashion is divided into parts corresponding to respective plural number of photoelectric converting regions by means of an energy beam. More specifically, an energy beam is irradiated on the portion of the first electrode film equivalent to the entire periphery of the film part to completely remove the first electrode film at the periphery of each first electrode film part. That is, each first electrode film part is formed as an island region. Thereafter, the semiconductor film and the second electrode film are formed in sequence, and thereby the photovoltaic device is fabricated.

In a preferred embodiment, each photoelectric converting region is provided in a rectangular shape or an approximate shape thereof, and an energy beam is irradiated along longitudinal and lateral sides of that rectangular shape or approximate shape thereof.

In accordance with the present invention, the first electrode film at the periphery of each photoelectric converting region is completely removed, and thereby respective first electrode film parts are reliably separated from each other and thus the first electrode film part is formed as an island region, and therefore an occurrence of short-circuit accident in the photoelectric converting region caused by a mutual contact of the first electrode film parts can be reliably prevented.

Detailed description on the present invention which is made hereinafter in reference to the attached drawings will further clarify the above-described objective and other objectives, features, aspects and advantages of the present invention.

DESCRIPTION OF THE PREFERRED EMBODIMENTS

Figure 3:
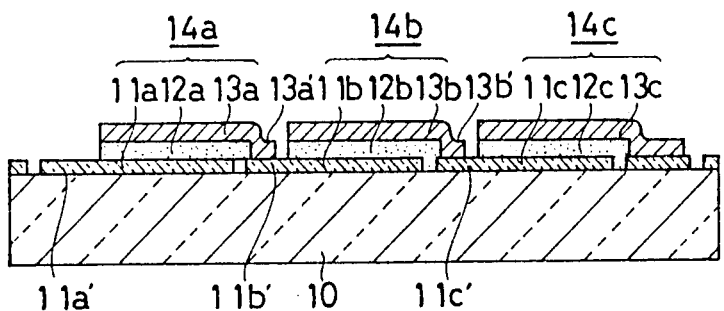
FIG. 3 is a cross-sectional view showing one example of a photovoltaic device manufactured in accordance with the method of an embodiment of the present invention.
Figure 4:
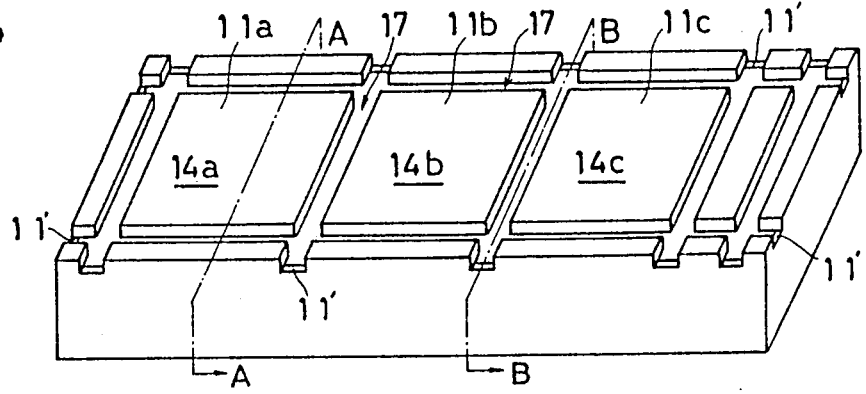
FIG. 4 is a perspective view showing one example of the pattern of the first electrode film parts.

FIG. 3 is a cross-sectional view showing one example of a photovoltaic device which is manufactured in accordance with the present invention. First, the substrate 10 comprising a transparent (or semitransparent) insulating material, for instance, glass, plastics or the like, of about 1 mm-3 mm in thickness is prepared. Then, a transparent conductive film comprising, for instance, tin oxide ($SnO_2$) which has a thickness of, for example, 2000 Å–5000 Å is formed on the one main surface of the substrate 10 in a substantially entire fashion. Then, this transparent conductive film is patterned by means of, for example, a laser beam as shown in FIG. 4, and the transparent conductive film parts 11a, 11b and 11c corresponding to respective photoelectric converting ranges 14a, 14b and 14c are formed. For such a transparent conductive film, indium oxide ($In_2O_3$) or ITO (indium tin oxide: ($In_2O_3 + SnO_2$)) are employed besides $SnO_2$. Furthermore, for the transparent conductive film, other TCOs (Transparent Conductive Oxide) which are well known to the skill of the art may be employed in a form of monolayer or in a form of laminated layer of tin oxide on TCO including the above-mentioned TCO. By adopting such a laminated structure, diffusion of, for example, indium into semiconductor of amorphous silicon is prevented effectively.

Figure 1:
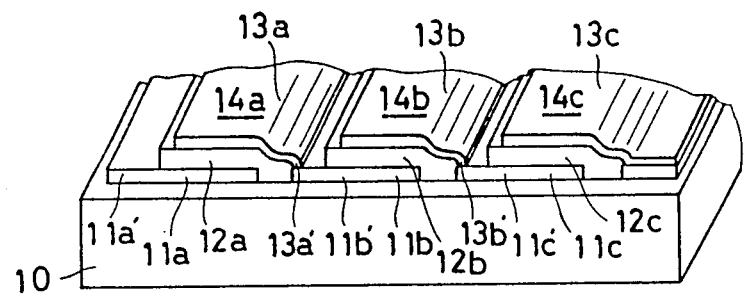
FIG. 1 is a perspective view of the major part showing one example of a photovoltaic device which is the background of the present invention.
Figure 2:
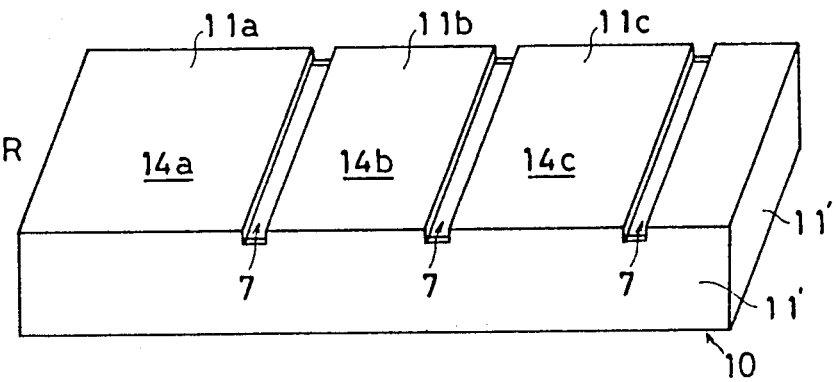
FIG. 2 is a perspective view showing an example of the pattern of transparent conductive film parts, namely, the first electrode film parts.

The transparent conductive film parts 11a, 11b and 11c are formed in such a manner that a transparent conductive film is formed on the substrate 10 in a substantially entire fashion, and thereafter the transparent conductive film part equivalent to the space 17 in FIG. 4 is removed by irradiating a laser beam. The YAG laser of about 1.06 μm in wavelength is suitable for this purpose. The width of the space 17 is set, for instance, to about 100 μm. What is to be noted here is that the transparent conductive film parts 11a, 11b and 11c are separated or divided from each other by the pattern as shown in FIG. 4, that is, by the space 17. As shown in FIG. 2, conventionally, the transparent conductive film parts 11a, 11b, and 11c have been separated or divided only by the spaces 7,7, . . . extending in the direction of width of the substrate 10. Also, conventionally, the pattern of the transparent conductive film part as shown in FIG. 2 has been considered to be sufficient in practical use.

Figure 5A:
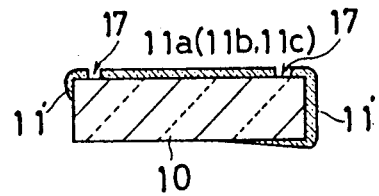
FIG. 5 is a cross-sectional view at a line A—A in FIG. 4.
FIG. 5B is a cross-sectional view at a line B—B in FIG. 4.
Figure 5B:
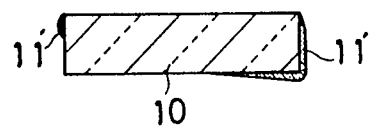

However, the results of the experiments conducted by the present inventors showed that this patterning of the transparent conductive film parts caused short-circuit in each photoelectric converting region. That is, the present inventors conducted various experiments, and examined the state of mutual electric conduction between respective transparent film parts before the semiconductor film was formed. As a result, in several samples, it was found that these transparent conductive film parts, namely, the first electrode film parts are in a mutually conductive state. And the examination of cause of such an electric conduction clarified the fact that the transparent conductive film material adhered to the side surface and the other main surface of the substrate 10 as shown in FIG. 2, FIG. 5A and FIG. 5B, and therefore the transparent conductive film parts 11a, 11b and 11c were in a mutually conductive state through this adhering transparent conductive film 11'. Thus, the adhesion of the transparent conductive film material on the side surface and the other main surface of the substrate 10 is caused by a slight stretch of vapor stream of that film material up to the side surface and the other main surface of the substrate 10 other than the vapor stream to one main surface thereof, for example, when the transparent conductive film is formed by means of evaporation by an electron beam. Then, the transparent conductive film 11' thus adhering is transparent of course, and accordingly the presence of such an adhering film is difficult to be detected with the naked eye, and therefore the above-described short-circuit accident was caused. Conventionally, the short-circuit accident caused by such an adhering film has not been clarified at all, and has not so much as recognized.

In such circumstances, in order to divide the transparent conductive film corresponding to respective photoelectric converting regions 14a, 14b and 14c, the present inventors were struck with an idea of forming the transparent conductive film parts 11a, 11b and 11c as island regions by irradiating an energy beam such as, for instance, a laser beam onto the entire peripherals of the transparent conductive film parts 11a, 11b and 11c as shown in FIG. 4. When respective transparent conductive film parts 11a, 11b and 11c are formed as island regions, respective transparent conductive film parts 11a, 11b and 11c are never electrically conductive to each other, even if, for example, as shown in FIG. 5A and FIG. 5B, the undesirably adhering films 11', 11', ... are present on the side surface and the other main surface of the substrate 10. That is, as particularly obvious from FIG. 5A, the adhering film 11' and the transparent conductive film part 11a (11b and 11c) is electrically separated or divided completely from each other by the space 17. Accordingly, even when the semiconductor film parts 12a, 12b and 12c, and subsequently the second electrodes, namely, the back electrode film parts 13a, 13b and 13c are formed in sequence, no short-circuit accident will happen in the respective photoelectric converting regions 14a, 14b and 14c. Furthermore, as shown in FIG. 4, in the process of forming the transparent conductive film parts 11a, 11b and 11c, even if a laser beam is irradiated onto the transparent film, only the transparent substrate 10 is present under this, and the laser beam is transmitted through the substrate, and therefore the substrate 10 is scarcely damaged by the laser beam.

In order to divide into the transparent conductive film parts 11a, 11b and 11c corresponding to respective photoelectric converting regions, other energy beams such as an electron beam or an ion beam may be utilized.

In the case where the semiconductor film parts 12a, 12b and 12c as shown in FIG. 3 are formed, firstly a non-single crystalline semiconductor film such as amorphous silicon in an entirely continuous state is formed on the substrate 10 so that the semiconductor film covers the surfaces of respective transparent conductive film parts 11a, 11b and 11c. When the semiconductor film is amorphous silicon film, this is formed by means of the well-known glow discharge in the silane atmosphere. Such a method of forming an amorphous film is disclosed, for instance, in the U.S. Pat. No. 4,281,208 which was cited previously and another U.S. Pat. No. 4,064,521. The thickness of the semiconductor film is selected, for instance, to 5,000 Å–7,000 Å. This amorphous silicon film, namely, semiconductor film contains the PIN junction which is parallel to the film surface. Concretely, the P type amorphous silicon film is formed first, and then the I type (non-doped layer) and the N type amorphous silicon films are formed thereon in sequence. For the P type layer, amorphous silicon carbide (a-si $_x$c$_{1-x}$) can be utilized. Furthermore, for the I type layer, mixed phase of amorphous silicon and microcrystal can be utilized besides amorphous silicon. For the N type layer, amorphous silicon germanium (a-Si$_x$Ge$_{1-x}$) can be utilized.

Furthermore, for the semiconductor film, the microcrystal semiconductor and the polycrystalline semiconductor can be utilized besides the above-described amorphous silicon semiconductor. For instance, cadmium series semiconductors such as sintered cadmium sulfide (CdS), cadmium telluride (CdTe) and the like may be employed.

As shown in FIG. 3, the semiconductor parts 12a, 12b and 12c are formed in such a manner that the transparent conductive film parts 11a and 11b located thereunder and the end portions 11a', 11b' and 11c' thereof are exposed beyond the end portions in the longitudinal direction of the substrate 10 of the corresponding semiconductor film parts. To divide the continuous semiconductor film into respective parts 12a, 12b and 12c, chemical-etching, plasma etching or the like is utilized.

On the semiconductor film parts 12a, 12b and 12c which are formed as described above, the back electrode film of 2000 Å–1 μm in thickness is formed which is continuous over nearly the entire surface. This back electrode film comprises, for instance, aluminum. For the back electrode film, aluminum-alloy (for instance, AlSi), gold (Au), copper (Cu), titanium (Ti), nickel (Ni), indium (In), platinum (Pt), titanium silver (TiAg), chromium (Cr) or the like may be employed besides aluminum. However, in view of low price and good light reflection, aluminum is suitable for the second electrode film, namely, the back electrode film.

Thereafter, the back electrode film is divided into the back electrode film parts 13a, 13b and 13c corresponding to respective photoelectric converting regions 14a, 14b and 14c, for instance, by irradiating a laser beam. For the laser which can be utilized for this purpose, the laser beam of about 1.06 m in wavelength from the YAG laser is utilized. Concretely, this laser beam has an average power of 1.0 watt, and the pulse repetition rate is 2 kHz, and the object lens of 50 mm in focal length is employed. In addition, other energy beam such as the electron beam or the ion beam may be utilized. These back electrode film parts 13a, 13b and 13c are electrically connected to the transparent conductive film parts of the adjacent photoelectric converting regions. That is, the end portion 13a' of the back electrode film part 13a of the photoelectric converting region 14a is directly connected to the end portion 11b' of the transparent conductive film part 11b of the adjacent photoelectric converting region 14b and the end portion 13b' of the back electrode film part 13b of the photoelectric converting region 14b is directly connected to the end portion 11c' of the transparent conductive film part 11c of the adjacent photoelectric converting region 14c, respectively.

Thus, the photovoltaic device of the structure as shown in FIG. 3 is obtained. Then, when the light impinges from the back surface of the substrate 10, photoelectromotive forces are generated in respective photoelectric converting regions 14a, 14b and 14c, and these electric powers are taken out between the transparent conductive film part 11a and the back electrode film part 13c by cumulating in a series fashion.

Figure 6:
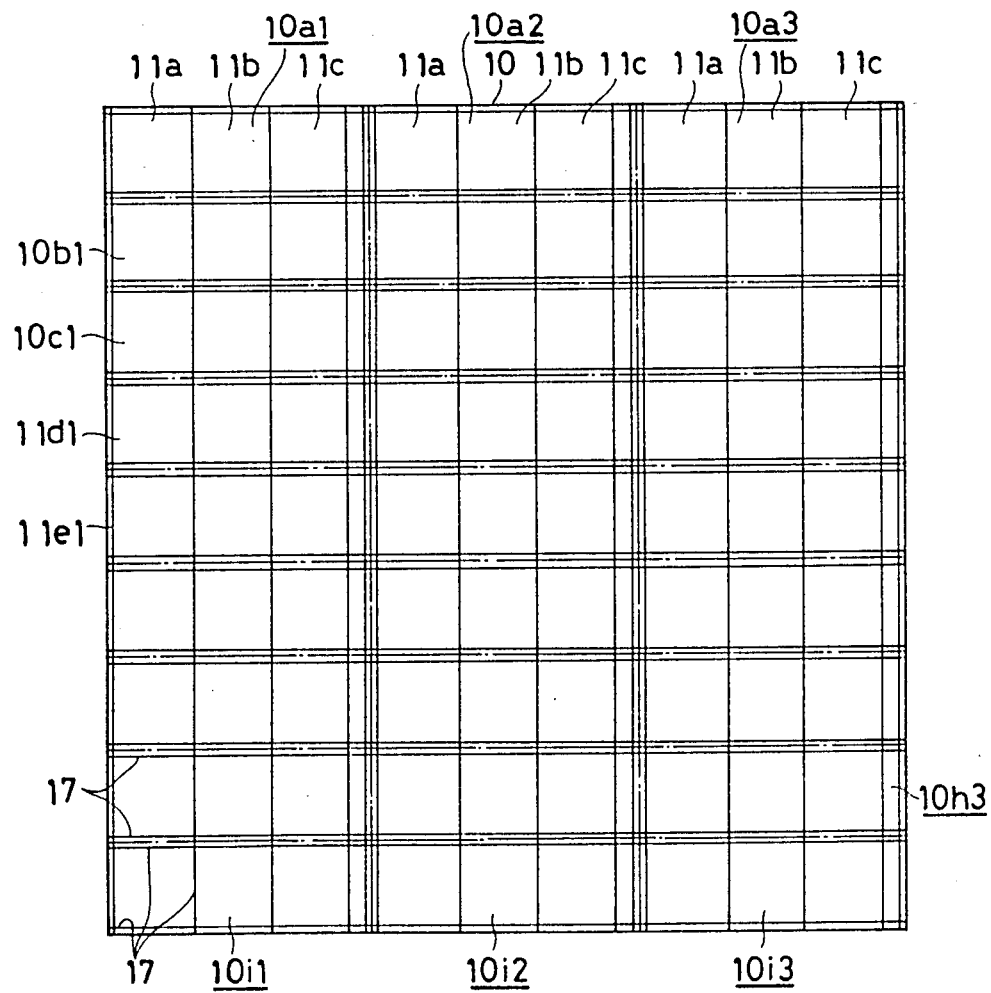
FIG. 6 is a plan view for explaining another embodiment of the present invention.

FIG. 6 is a plan view for explaining an example of a method of manufacturing a module containing, for example, three photoelectric converting regions on respective module substrates 10a1, ..., 10i3 in such a manner that a number of, for example, 27 photovoltaic devices are formed simultaneously on one large substrate 10, and thereafter scribing is performed along the dash-dot lines. In FIG. 6, the square-shaped full lines depicted most outside show the substrate 10, and other full lines show the scanning lines of laser beam for dividing the transparent conductive film into respective parts corresponding to respective photoelectric converting regions, that is, the spaces 17 in FIG. 4. Accordingly, it is understood that also in this embodiment, respective transparent conductive film parts 11a, 11b and 11c are formed as island regions likewise the previous embodiment. In an example as shown in FIG. 6, when the present invention is not applied, the first line module substrates 10a1, 10a2 and 10a3 and the ninth line module substrates 10i1, 10i2 and 10i3 having a possibility of forming the adhering film 11' on the side face thereof have a risk of short-circuit accident, that is, electric conduction of the transparent conductive film parts 11a, 11b and 11c to each other. And then, the other second through eighth line module substrates 10b1 through 10h3 have no electric conduction of respective transparent conductive film parts to each other since no risk is present that the transparent conductive film material adheres to the side faces of both ends in the direction of width. However, in this embodiment, for all the module substrates 10a1 through 10i3, all the transparent conductive film parts are formed as island regions by irradiating a laser beam in the direction of line (longitudinal direction thereof). The reason is that all the modules are intended to have the same appearance. This is because if the appearance differs depending upon the module, when such a module is employed, for instance, for the power supply for the small-sized electronic equipment such as wristwatch, electronic desk-top calculator or the like, the appearance of that electronic equipment varies, being unfavorable for design.

Figure 7A:
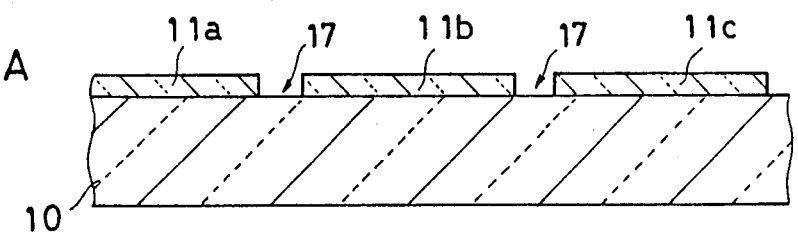
FIG. 7A through FIG. 7F are cross-sectional view showing still another embodiment of the present invention in the sequence of processes.

Next, description is made on the other embodiment in accordance with the present invention in reference to FIG. 7A through FIG. 7F, FIG. 8A through FIG. 8F, and FIG. 9A through FIG. 9F. The substrate 10 comprises a transparent insulating material the same as the previous embodiment. And then, a transparent conductive film is formed on nearly the entire surface of the substrate 10, and the transparent conductive film is divided into respective transparent conductive film parts 11a, 11b and 11c as shown in FIG. 7A, FIG. 8A and FIG. 9A. These transparent conductive film parts 11a, 11b and 11c are formed as island regions like the case in FIG. 4. Accordingly, as is obvious particularly from FIG. 8A, the film 11' adhering to the side face and the other main surface of the substrate 10 and the transparent conductive film part 11a(11b, 11c) is completely insulated from each other by the space 17.

Figure 7B:
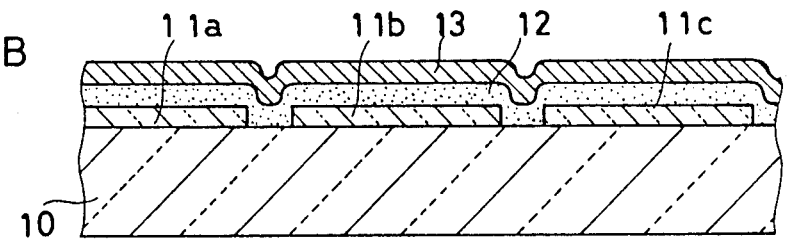
Figure 8A:
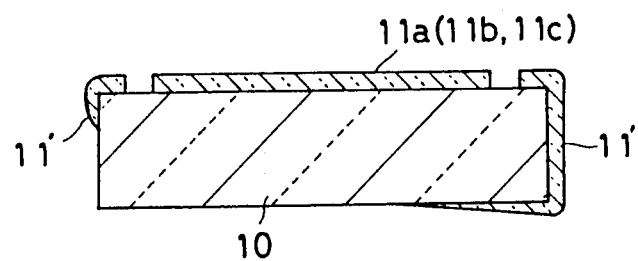
FIG. 8A through FIG. 8F are cross-sectional view for explaining the processes in sequence after FIG. 7A through FIG. 7F, being equivalent to the cross-sectional view at the line A—A in FIG. 4 the same as FIG. 5A.
Figure 8B:
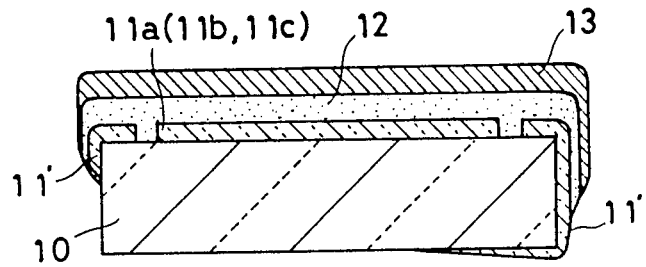
Figure 9A:
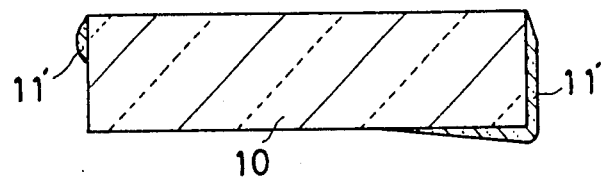
FIG. 9A through FIG. 9F are cross-sectional views for explaining the processes in sequence after FIG. 7A through FIG. 7F, being equivalent to the cross-sectional view at the line B—B in FIG. 4 the same as FIG. 5B.
Figure 9B:
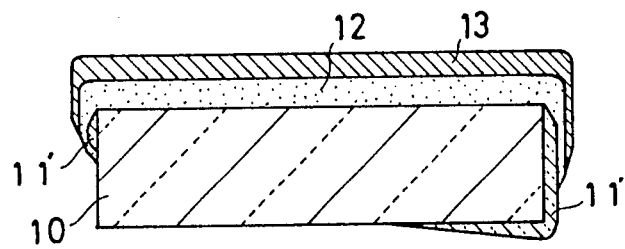

Next, as shown in FIG. 7B, FIG. 8B and FIG. 9B, a semiconductor film 12 in a state of continuity over the entire surface is formed on the substrate 10 including the surfaces of respective transparent conductive film parts 11a, 11b and 11c. The layer structure and material of this semiconductor film 12 are the same as described previously. Furthermore, a back electrode film 13 is formed on the semiconductor film 12. The material for this back electrode film 13 is also the same as described previously.

Figure 7C:
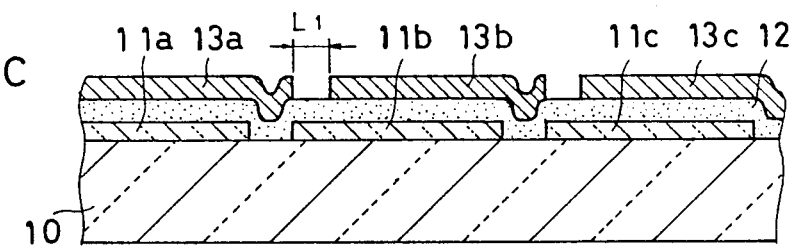
Figure 8C:
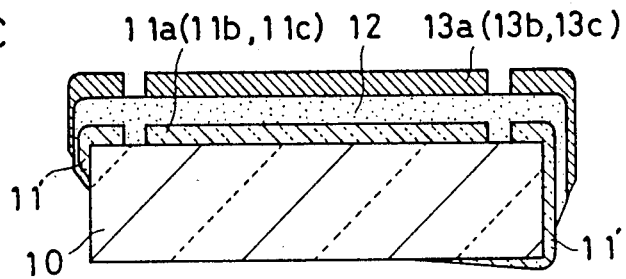
Figure 9C:
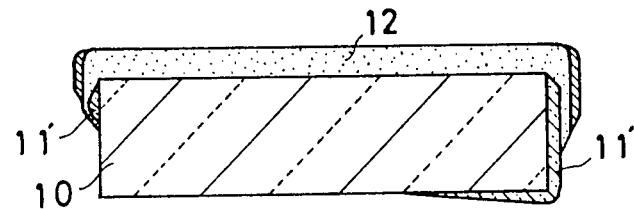

Thereafter, as shown in FIG. 7C, FIG. 8C and FIG. 9C, the portion of the back electrode film equivalent to a space L1 is removed to form the discrete back electrode film parts 13a, 13b and 13c corresponding to respective photoelectric converting regions. Like the previous case, the laser beam and other energy beams are utilized also in this case. In addition, the space L1 is about 100 μm. Furthermore, in the process of forming this space L1, even if the back electrode film material scatters by irradiating an energy beam, no scattered material adheres to the semiconductor film 12 because the semiconductor film 12 has already covered with the back electrode film 13.

Figure 7D:
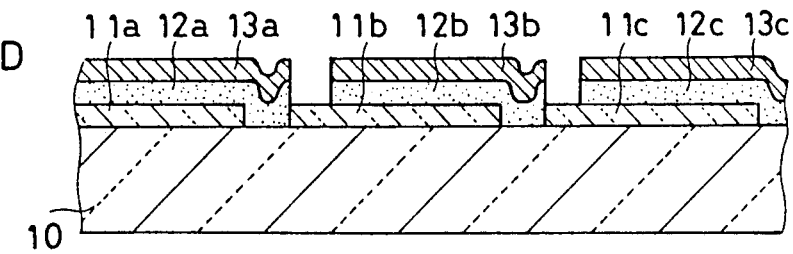
Figure 8D:
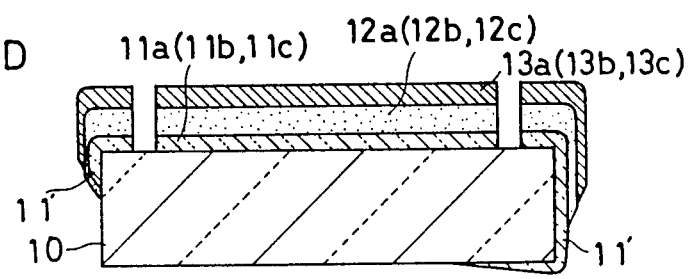
Figure 9D:
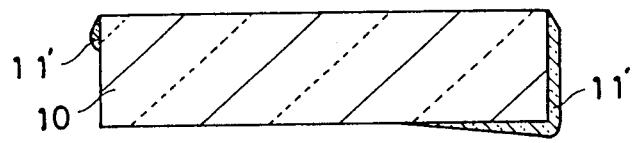

In the process as shown in FIG. 7D, FIG. 8D and FIG. 9D, the semiconductor film exposed at the portion of the space L1 (FIG. 7C) is removed by means of plasma etching with respective back electrode film parts 13a, 13b and 13c acting as masks, and thereby the semiconductor film parts 12a, 12b and 12c of the same shapes as those of respective back electrode film parts 13a, 13b and 13c are formed. For such plasma etching, both the plasma etching utilizing the glow discharge and the plasma etching utilizing the magnetron discharge can be employed. However, the reactive ion etching is preferably utilized. As an example, such a reactive ion etching employs an induction couple type apparatus and is performed under the following etching conditions. Normal temperature, high frequency power source of 13.56 MHz, carbon fluoride ($CF_4$) 96% and oxygen ($O_2$) 4%. What is to be noted here is that the etching of semiconductor film is performed with respective back electrode film parts 13a, 13b and 13c acting as masks. That is, as described previously, even if the part of semiconductor film located under the back electrode film is damaged by the energy beam irradiated onto the back electrode film, no problem takes place because the amorphous silicon film of that part is removed by the dry etching in the process in FIG. 7D, FIG. 8D and FIG. 9D. This is the reason why the back electrode film parts 13a, 13b and 13c can be worked precisely by using an energy beam in the process as shown in FIG. 7C, FIG. 8C and FIG. 9C.

Figure 7E:
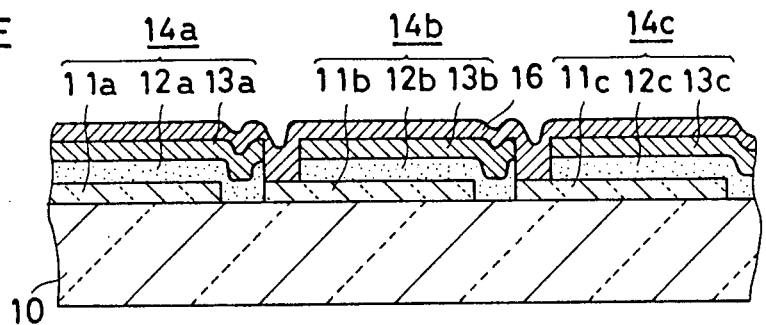
Figure 8E:
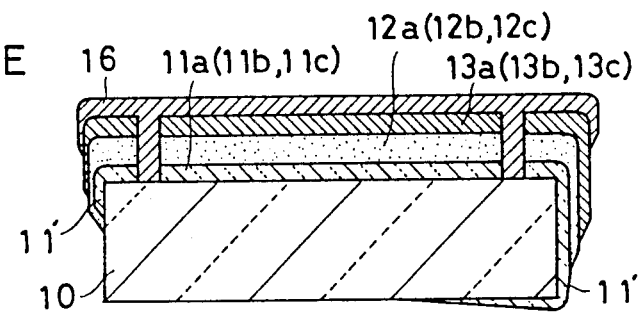
Figure 9E:
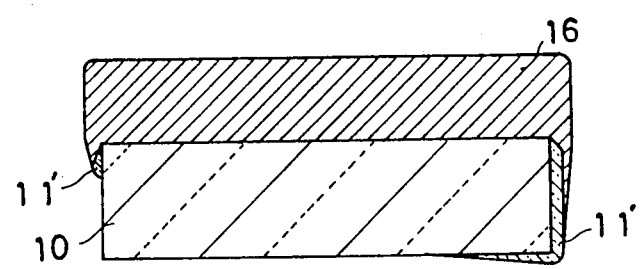

In the process as shown in FIG. 7E, FIG. 8E and FIG. 9E, a connecting electrode film 16 of about 1,000 Å–5,000 Å in thickness is formed over the entire surfaces of the back electrode film parts 13a, 13b and 13c including the parts of transparent conductive film exposed at the portions equivalent to the spaces L1 (FIG. 7C). For this connecting electrode film 16, for instance, titanium and the like are used which have better humidity resisting property compared with the back electrode films 13a, 13b and 13c. Furthermore, since this connecting electrode film 16 is provided to connect the transparent conductive film parts to the adjacent back electrode film parts, it is not necessary to be formed so as to cover the entire surfaces of respective back electrode film parts 13a, 13b and 13c.

Figure 7F:
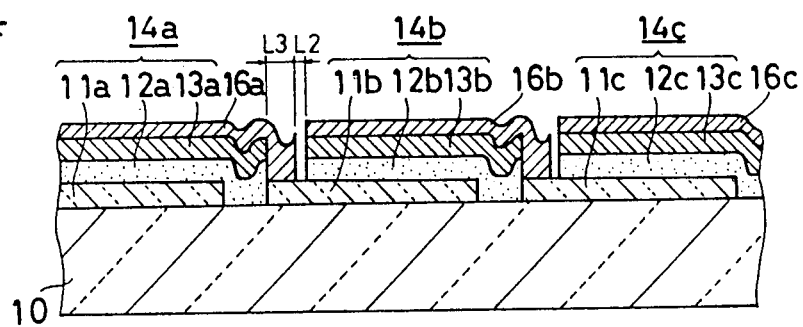
Figure 8F:
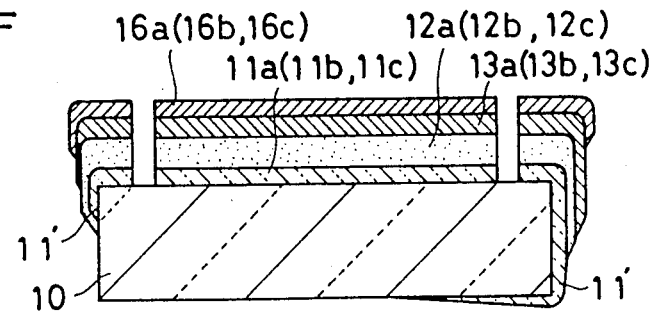
Figure 9F:
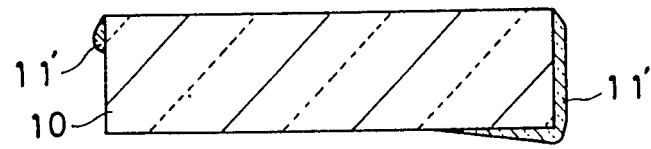

Subsequently, as shown in FIG. 7F, FIG. 8F and FIG. 9F, the connecting electrode film equivalent to the space L2 is removed, for example, by irradiating an energy beam such as a laser beam. The laser beam used at this time may be the same as is used when the back electrode film 13 is removed. Then, the space L2 is selected to about 20 μm. Width of connection between the connecting electrode film part 16a and the transparent conductive film part 16b and the width of connection between the connecting electrode film part 16b and the transparent conductive film part 11c, L3 is, for instance, about 80 μm. Thus, discrete photoelectric converting regions 14a, 14b and 14c are formed. And then, photoelectromotive forces generated by these photoelectric converting regions 14a, 14b and 14c are taken out cumulatively in a series fashion.

Furthermore, in the process as shown in FIG. 7F, FIG. 8F and FIG. 9F, the photoetching technique may be employed in place of the above-mentioned method of irradiating an energy beam. Furthermore, formation of the connecting electrode film parts 16a, 16b and 16c may be performed by means of evaporation or vapor deposition which is performed through the masks.

Still another embodiment in accordance with the present invention as shown in FIG. 10A through FIG. 10F is a method whereby an undesirable short-circuit between the material for the back electrode film or the connecting electrode film which melts and droops by irradiating an energy beam such as the laser beam and the transparent conductive film part can be prevented effectively.

Figure 10A:
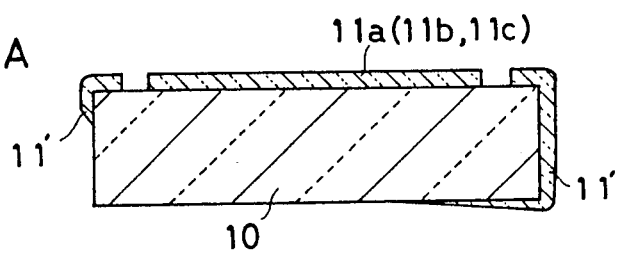
FIG. 10A through FIG. 10F are cross-sectional views showing a modified example of FIG. 8A through FIG. 8F.
Figure 10B:
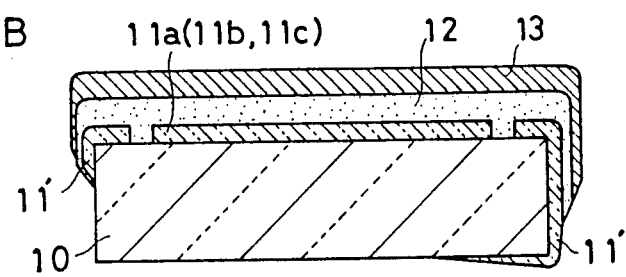

FIG. 10A and FIG. 10B show the same processes as those in FIG. 8A and FIG. 8B.

Figure 10C:
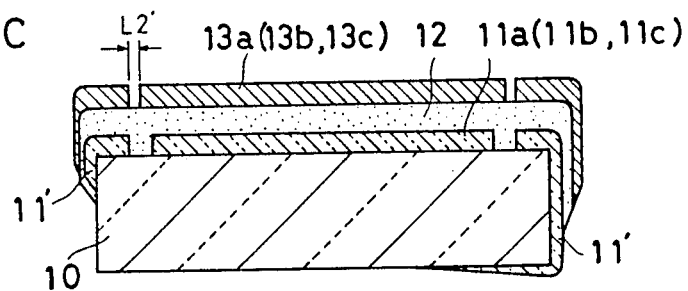
Figure 10D:
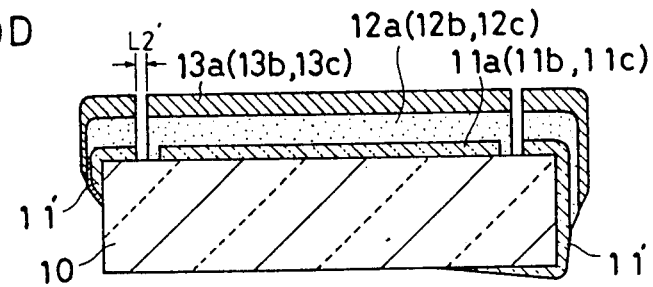
Figure 10E:
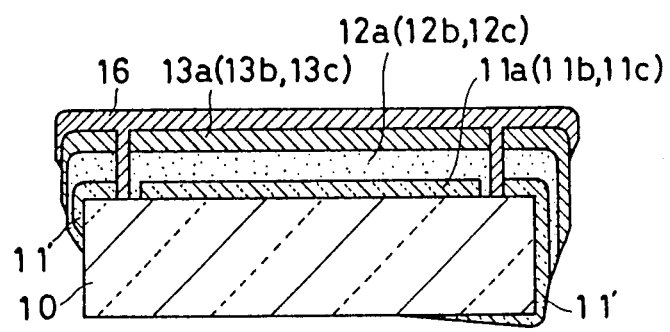
Figure 10F:
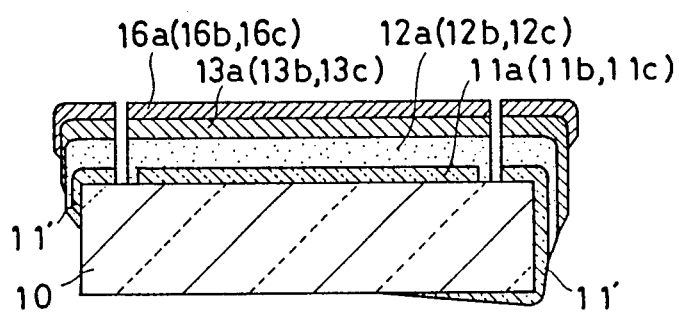

In FIG. 10C, like the cases of FIG. 7C, FIG. 8C and FIG. 9C, the second electrode film 13 is removed, for instance, by a laser beam. At this time, a width of removal of the second electrode film L2' is made smaller compared with the width L2 in the previous embodiment. Then, as shown in FIG. 10D, the semiconductor film 12 (FIG. 10C) is etched by plasma with the back electrode film part 13a (13b, 13c) acting as the masks. In this process as shown in FIG. 10D, the width of removal of semiconductor film is the same as that of removal of the back electrode film L2'. Accordingly, the end edge of the transparent conductive film part 11a (11b, 11c) in the direction of width of the substrate 10 is covered with the semiconductor film 12a(12b, 12c). That is, exposure of the end part of the transparent conductive film 11a in the direction of width of the substrate 10 is prevented by the semiconductor film 12a. Then, in the process as shown in FIG. 10E, the connecting electrode film 16 is formed over the entire surface, and in the succeeding process as shown in FIG. 10F, this connecting electrode film 16 is divided into respective part 16a (16b, 16c), for example, by a laser beam. At this time, even if the material for the connecting electrode film 16 or the material for the back electrode film 13 melts and droops, there is no risk of short-circuit between the melted metal material and the transparent conductive film part because the transparent conductive film part 11a (11b, 11c) is protected by the semiconductor film part 12a (12b, 12c).

Figure 11:
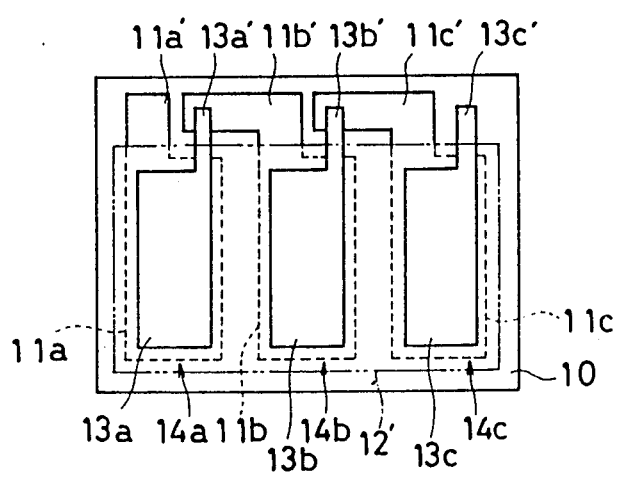
FIG. 11 is a plan view showing one example of a photovoltaic device which is manufactured in accordance with another embodiment of the present invention.

FIG. 11 is a plan view showing another example of the photovoltaic device, and this example is of the structure as shown in FIG. 2 in the U.S. Pat. No. 4,281,208 cited previously, which was assigned to the present assignee. That is, on the substrate 10, the transparent conductive film parts 11a, 11b and 11c are formed corresponding to respective photoelectric converting regions 14a, 14b and 14c, and thereon a continuous sheet of semiconductor film 12' is formed, and subsequently the back electrode film parts 13a, 13b and 13c are formed. A leader 13a' of the back electrode film 13a of the photoelectric converting region 14a is connected to a leader 11b' of the transparent conductive film part 11b of the adjacent photoelectric converting region 14b, and a leader 13b' of the back electrode film part 13b of the photoelectric converting region 14b is electrically connected to a leader 11c' of the transparent conductive film part 11c of the adjacent photoelectric converting region 14c. Then, photoelectromotive forces generated by respective photoelectric converting regions 14a, 14b and 14c are taken out in a series fashion by a leader 11a' of the transparent conductive film part 11a of the photoelectric converting region 14a and a leader 13c' of the back electrode film part 13c of the photoelectric converting region 14c.

Figure 12:
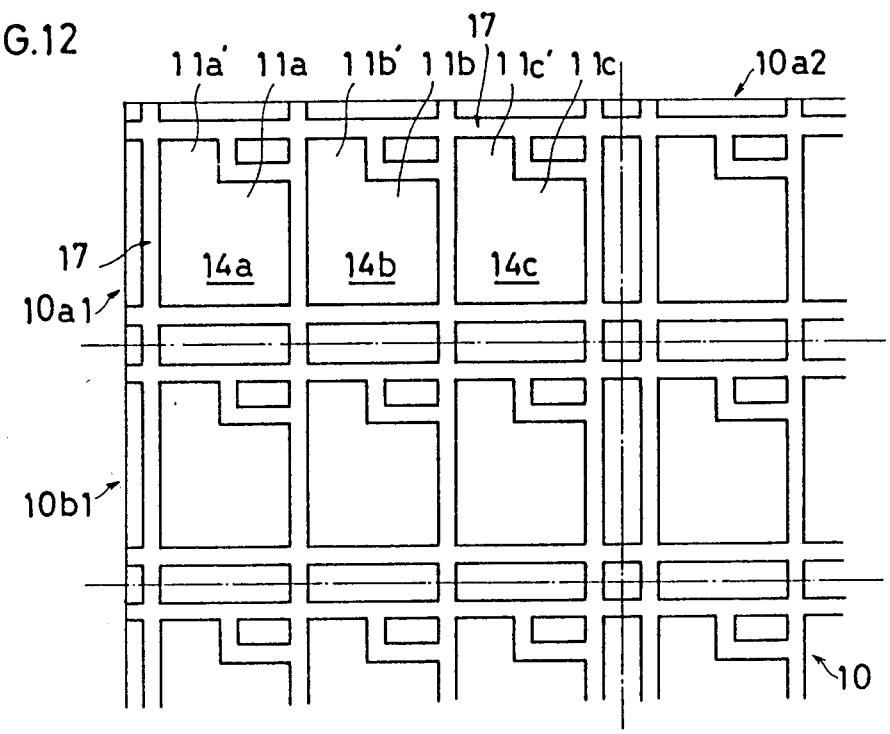
FIG. 12 through FIG. 15 are plan views for explaining other embodiments of the present invention in the sequence of processes.

FIG. 12 through FIG. 15 are views showing the processes of manufacturing a photovoltaic device of a structure as shown in FIG. 11, being equivalent to the previous FIG. 6. First, a transparent conductive film is formed on one main surface of the substrate 10 in a substantially entire fashion. And then, as shown in FIG. 12, the transparent conductive film parts 11a, 11b, 11c, . . . are formed corresponding to respective photoelectric converting regions, for example, by employing a laser beam. At this time, respective transparent conductive film parts 11a, 11b, 11c, . . . are formed as island regions like the previous embodiment. That is, the spaces 17 surround the peripheries of respective transparent conductive film parts 11a, 11b, 11c, . . . .

Figure 13:
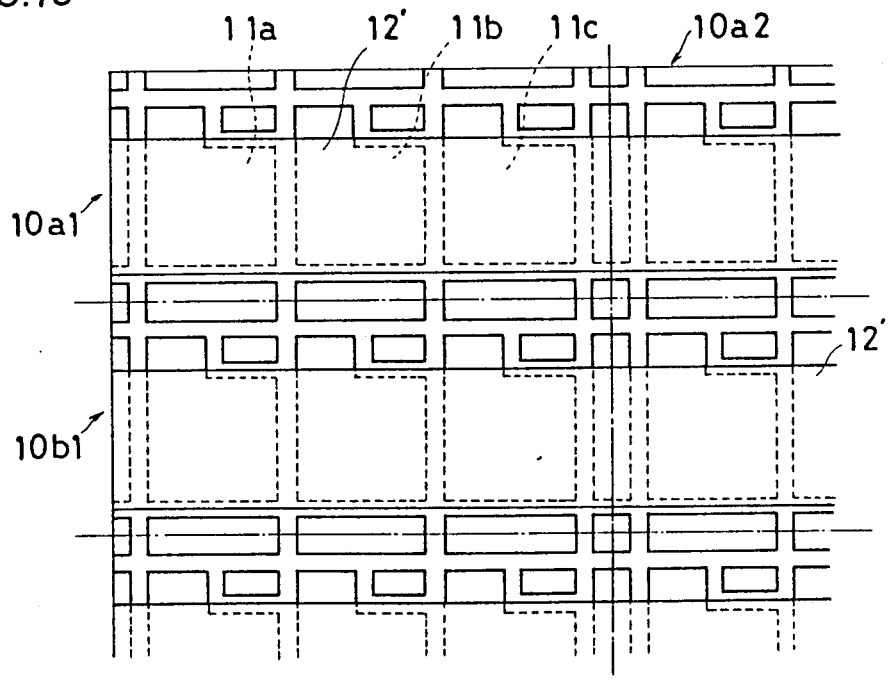

Subsequently, as shown in FIG. 13, a semiconductor film 12' is formed which continues in common to respective transparent conductive film parts 11a, 11b, 11c, . . . .

Figure 14:
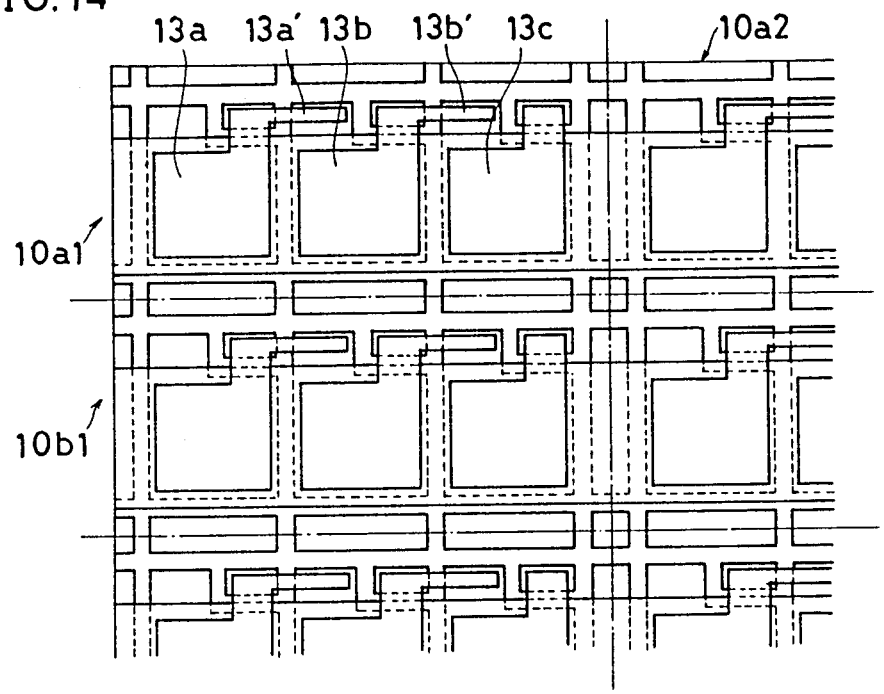

Thereafter, as shown in FIG. 14, the back electrode film parts 13a, 13b, 13c, . . . corresponding to respective photoelectric converting regions are formed, for example, by the method of selective evaporation using the mask.

Figure 15:
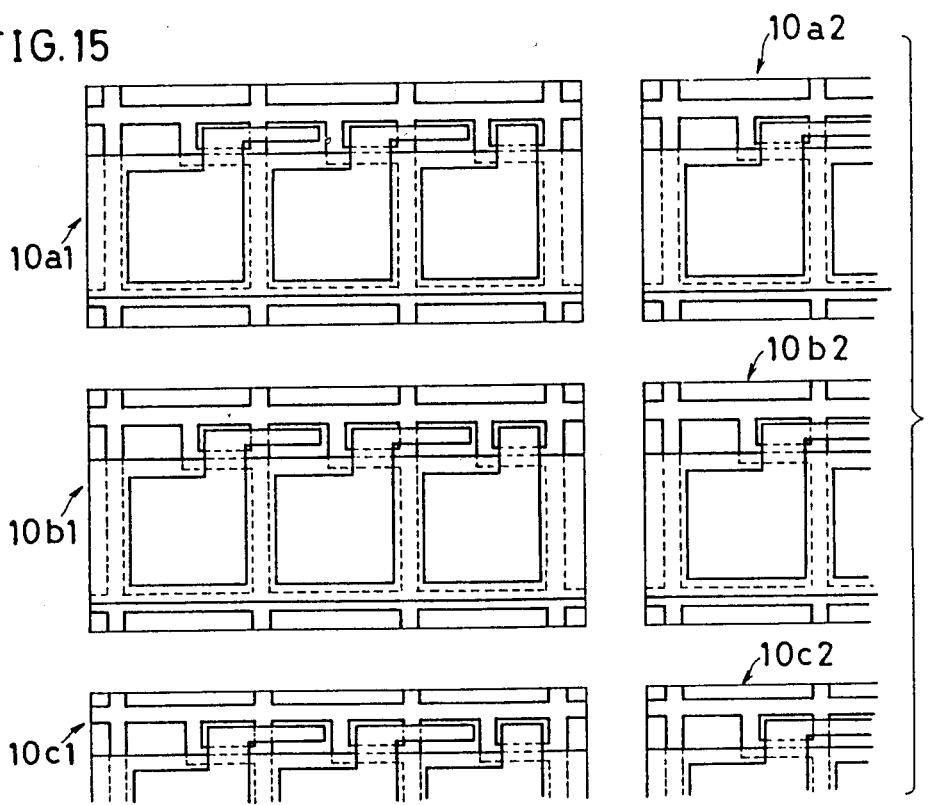

Finally, as shown in FIG. 15, the substrate is divided into respective module substrates 10a1, 10a2, . . . by scribing the portions as shown by the dash-dot lines in FIG. 14. This is the same as the previous example as shown in FIG. 6.

Furthermore, all the above-described embodiments have a structure that the light impinges from the other main surface of the substrate 10. However, the present invention can be applied also even to a photovoltaic device having a structure that the light impinges from the back electrode film side. For example, a photovoltaic device can be considered whose structure is such that the substrate 10 is formed with ceramics or a heat-resistant high polymer material, for instance, polyimide or the like, and thereon the same shaped metal electrode film parts are formed in place of the transparent conductive film parts 11a, 11b and 11c, and thereon the semiconductor film or semiconductor film parts are formed, and then the uppermost layer of transparent conductive film part is formed. Even in a photovoltaic device having such a structure, the first electrode film, namely, the metal electrode film part can be worked to form an island region as is obvious particularly from FIG. 4, and by this measure an occurrence of short-circuit accident can be effectively prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a photovoltaic device comprising the steps of:
   (a) preparing a substrate having an insulating surface whereon a plurality of photoelectric converting regions are formed;
   (b) forming a first electrode film including a transparent conductive film on substantially all of said insulating surface of said substrate;
   (c) removing said first electrode film surrounding an entire periphery of each of said first electrode film to form island regions by irradiating an energy beam onto a part of said first electrode film substantially equivalent to an entire periphery of each of said photoelectric converting regions to divide said first electrode film into first electrode film parts corresponding to a plurality of said photoelectric converting regions;
   (d) forming a semiconductor film on said first electrode film parts said semiconductor film being divided corresponding to each of said photoelectric converting regions;
   (e) forming a plurality of second electrode film parts on said semiconducter film corresponding to each of said photoelectric converting regions; and (f) electrically connecting said first electrode film parts and said second electrode film parts of adjacent photoelectric converting regions to each other.

2. A method of manufacturing a photovoltaic device in accordance with claim 1, wherein each of said first electrode film parts is provided in a rectangular shape or an approximate shape thereof comprising sides in the longitudinal direction and sides in the lateral direction, and said step (c) comprises a step of removing said first electrode film along all said sides in the longitudinal direction and sides in the lateral direction.

3. A method of manufacturing a photovoltaic device in accordance with claim 1, wherein said step (c) comprises a step of irradiating a laser beam.

4. A method of manufacturing a photovoltaic device in accordance with claim 1, wherein said step (c) comprises a step of irradiating an electron beam.

5. A method of manufacturing a photovoltaic device in accordance with claim 1, wherein said step (c) comprises a step of irradiating an ion beam.

6. A method of manufacturing a photovoltaic device in accordance with any one of claims 1 and 2 through 5, wherein said step (d) comprises a step (d-i) of forming a non-single crystalline semiconductor film on a plurality of first electrode film parts being divided corresponding to respective photoelectric converting regions in a substantially entire fashion.

7. A method of manufacturing a photovoltaic device in accordance with claim 6, wherein said step (d) comprises a step (d-ii) of further separating a non-single crystalline semiconductor film being formed in said step (d-i) corresponding to each photoconverting region.

8. A method of manufacturing a photovoltaic device in accordance with any one of claims 1 and 2 through 5, wherein said step (e) comprises the steps of:
(e-i) forming said second electrode film in a substantially entire fashion, and
(e-ii) separating said second semiconductor film into the second electrode film parts corresponding to respective photoelectric converting regions.

9. A method of manufacturing a photovoltaic device in accordance with claim 8, wherein
said step (d) comprises a step of forming said semiconductor film so that the end portion of said first electrode film part in the longitudinal direction of said substrate will be exposed,
said step (e-i) comprises a step of forming said second electrode film so as to be superposed on the exposed part of said first electrode film part, and thereby said step (f) is accomplished.

10. A method of manufacturing a photovoltaic device in accordance with claim 8, wherein
said step (d) comprises a step of forming said semiconductor film so that the end portion of said first electrode film part in the longitudinal direction of said substrate will be exposed,
said step (f) comprises a step of forming the connecting electrode film part so as to be superposed on the end portion of said exposed first electrode film.

* * * * *